United States Patent
Maier et al.

(10) Patent No.: US 11,874,360 B2
(45) Date of Patent: Jan. 16, 2024

(54) METHOD AND MAGNETIC RESONANCE APPARATUS FOR QUANTITATIVE, HIGHLY REPRODUCIBLE TISSUE DIFFERENTIATION

(71) Applicants: Stephan Ernst Maier, Askim (SE); Stefan Kuczera, Pixbo (SE)

(72) Inventors: Stephan Ernst Maier, Askim (SE); Stefan Kuczera, Pixbo (SE)

(73) Assignee: Stephan Maier, Chestnut Hill, MA (US)

( * ) Notice: Subject to any disclaimer, the term of this patent is extended or adjusted under 35 U.S.C. 154(b) by 92 days.

(21) Appl. No.: 17/698,899

(22) Filed: Mar. 18, 2022

(65) Prior Publication Data

US 2023/0296711 A1  Sep. 21, 2023

(51) Int. Cl.
*G01R 33/563* (2006.01)
*G01R 33/56* (2006.01)

(52) U.S. Cl.
CPC ... *G01R 33/56341* (2013.01); *G01R 33/5602* (2013.01); *G01R 33/5608* (2013.01)

(58) Field of Classification Search
CPC ............ G01R 33/5602; G01R 33/5608; G01R 33/56341
See application file for complete search history.

(56) References Cited

U.S. PATENT DOCUMENTS

| | | | |
|---|---|---|---|
| 6,751,495 B2 | 6/2004 | Maier | |
| 9,568,580 B2* | 2/2017 | Dale | ............... G01R 33/56341 |
| 9,767,552 B2* | 9/2017 | Dobson | ............. G01R 33/5608 |
| 2022/0034985 A1 | 2/2022 | Maier | |

FOREIGN PATENT DOCUMENTS

WO  WO 2020/211959 A1  10/2020

OTHER PUBLICATIONS

Richter PH. Estimating Errors in Least-Squares Fitting. The Telecommunications and Data Acquisition Progress Report, TDA PR 42-122, Apr.-Jun. 1995, pp. 107-137. Pasadena, California: National Aeronautics and Space Administration, Jet Propulsion Laboratory, California Institute of Technology.

Langkilde F et al. Evaluation of Fitting Models for Prostate Tissue Characterization Using Extended-Range b-Factor Diffusion-Weighted Imaging. Magnetic Resonance in Medicine. Apr. 2018;79(4):2346-2358 (2018). John Wiley & Sons, Inc., Hoboken, New Jersey.

(Continued)

*Primary Examiner* — Gregory H Curran

(57) ABSTRACT

The present invention relates to parameter quantification for reproducible characterization of measured magnetic resonance signal variations in biological tissues due to variation in contrast-weighting levels. The method uses comprehensive sampling and higher-order model analysis to attain a more complete description of the signal variation at high signal-to-noise ratio. The signal variation described by the higher-order model fit is subsequently used for retrospective fit analysis based on a more basic model and a flexible sampling pattern. This approach greatly facilitates reproducibility of parameter quantification, since sampling inconsistencies can readily be accounted for.

15 Claims, 11 Drawing Sheets

(56) References Cited

OTHER PUBLICATIONS

Kuczera et al. Optimized bias and signal inference in diffusion-weighted image analysis (Obsidian). Magn Reson Med. Nov. 2021;86(5):2716-2732. John Wiley & Sons, Inc., Hoboken, New Jersey.

Maier et al. Prostate Cancer Diffusion-Weighted Magnetic Resonance Imaging: Does the Choice of Diffusion-Weighting Level Matter? J Magn Reson Imaging. Mar. 2022;55(3):842-853. Elsevier, Inc., Amsterdam, Netherlands.

\* cited by examiner

METHOD AND MAGNETIC RESONANCE APPARATUS FOR QUANTITATIVE, HIGHLY REPRODUCIBLE TISSUE DIFFERENTIATION

BACKGROUND OF THE INVENTION

The invention generally relates to methods for computing pathologically significant parameter maps associated with signals measured in magnetic resonance imaging MRI experiments. With MRI, images can be non-invasively obtained from the interior of an object or a human body located inside a magnetic resonance (MR) scanner. These images are characterized by outstanding spatial resolution and tissue contrast. The resulting tissue contrast is determined by scan parameter settings that change the sensitivity to the recovery or decay of the observed tissue signal. More particularly, an exponential signal recovery or decay can be related to magnetic field-dependent T1 relaxation, T2 relaxation or T2* relaxation. In biological tissues, the field-dependent relaxation occurs with time constants ranging from fractions of a millisecond to several seconds. With suitable encoding, Brownian motion, i.e., the physical process of molecular diffusion, can also generate signals that decay exponentially with encoding strength. Typically, for any of these physical processes, unless simple objects are studied, like liquids, the observed signal variation is multi-exponential by nature. For example, in biological tissues, even at high spatial resolution, the composite signal of multiple compartments at a cellular level, each with a characteristic exponential signal variation, is observed.

A great research effort has been made to design acquisition protocols and analysis approaches that permit a decomposition of this multi-exponential signal variation into distinct exponential components. Meanwhile, for typical clinical applications, such comprehensive measurement and detailed analysis is not practical. Nevertheless, there is a great interest to obtain simple-to-interpret quantitative maps based on a mono-exponential analysis of the complex signal behavior. In numerous studies, involving different organs and pathologies, it has been shown that such maps can be helpful to distinguish normal from abnormal tissue and even to categorize levels of abnormality and associated risk for disease progression. Such maps may also be helpful in artificial-intelligence supported classification. However, the mono-exponential signal analysis used to derive these maps cannot adequately describe the observed more complex signal variation of biological tissues. A consequence of this inadequate modeling of the signal variation is that the quantitative maps exhibit a pronounced dependence on acquisition parameters and, therefore, lack reproducibility in a clinical environment that uses a wide variety of acquisition protocols and MR equipment.

SUMMARY OF THE PRIOR ART

Tissue differentiation, localization and characterization always have been basic goals of MRI. Indeed, the potential to distinguish between normal tissue and tumor tissue using MRI techniques was recognized several decades ago. Early on it was realized that the spin-lattice, so called "T1", and especially the spin-spin, so called "T2", relaxation parameters are different between normal and cancerous tissue. Accordingly, by appropriately mapping the various T1 and/or T2 relaxation times determined from the MR signal of various voxels in an anatomical slice of interest as relative image amplitudes, it was possible to create images generally showing the demarcation of tumor tissue from adjacent normal tissue. More recently, mapping of the faster "T2*" relaxation parameter with so called gradient echo sequences has been proposed to measure tissue iron content and levels of deoxygenated hemoglobin. The observed signal recovery related to T1 relaxation, and signal decay related to T2 or T2* relaxation can be described with multi-exponential functions. Yet another important method that relies on the quantification of multi-exponential signal decays is MR diffusion-weighted imaging, which can be used to visualize the Brownian motion of molecules, e.g., water molecules, in tissues. In this regard, the diffusion-weighted images, but also the, so-called "apparent diffusion coefficient" (ADC) maps, as a quantitative measure of the diffusion-related signal decay, can provide useful information about the presence of acute stroke, fluid-filled cysts or tumor lesions.

In the intervening time period, methods of obtaining T1, T2, T2* or diffusion-weighted images and related quantitative maps using MRI techniques have vastly improved. In addition, a large amount of experience has been gained in the in vivo application of these methods and the added use of contrast agents has resulted in even better diagnostic possibilities. In fact, methodology has evolved to the point that the demarcation of tissue boundaries is considered to be basically conventional. Nevertheless, the categorization of tissue as normal or abnormal based on quantitative parameter maps is not entirely successful, since it was observed that the quantitative thresholds adopted for such categorization were not reproducible among the different imaging protocols and MR systems.

The most widespread clinical and research use of quantitative signal analysis in MR occurs in the context of diffusion imaging. It is also the area, where understanding the observed signal decays requires the most complex models and where a directional dependence plays a role. But many aspects of the problems that can arise in the analysis of such signal decays, are equally applicable to T1, T2, or T2* relaxation mapping. To better understand the analysis concepts involved, it will be instructive to first generally discuss some basics, such as the acquisition of diffusion-weighted signals with MRI and how the measured signal decays relate to the tissue under observation. First, the concepts of isotropic diffusion, the so-called "diffusion coefficient", and the measurement of the "diffusion coefficient" with MR will be presented in a generalized manner. Second, the concepts of the extension of the definition of diffusion to so-called "anisotropic" diffusion, and the characterization of diffusion with a diffusion tensor, rather than a single coefficient, will be introduced. Third, the effects of having multiple compartments with different diffusion properties within a detected voxel signal, such as the combined effect of blood perfusion in the micro-circulatory system and water diffusion in the surrounding tissue will be presented. Finally, the phenomenon of a departure from the normally adopted MR signal behavior when the diffusion encoding range is extended, will lead to a discussion of the present invention.

First, with regard to isotropic diffusion and its measurement using MR, it will be recognized that in a pure liquid such as water at room temperature, the individual water molecules are in constant motion due to the phenomenon of thermal agitation. This phenomenon is commonly referred to as "Brownian motion". The so-called "diffusion coefficient" (herein sometimes referred as "D") is a measure of this molecular motion, and it can be determined with MR techniques.

More particularly, a magnetic field gradient can be used to "tag" atomic level spins in a sample according to their location in space at the time of the application of a first magnetic field gradient to the sample. A second gradient, applied at a later time, then serves to probe how far, on average, the individual spins have moved between the time of the first gradient application and the time of the second gradient application. In the ideal case, these magnetic field gradients are applied in brief, strong bursts separated by a common well-defined time period. In clinical MR systems, the gradients are applied for a moderate duration of several milliseconds to several tens of milliseconds, and the leading edges of the respective bursts are separated by delays of similar, but slightly longer duration. The timing parameters δ and Δ refer to the duration of the diffusion gradient pulses and to the separation of their leading edges, respectively. Under these conditions, the diffusion encoding level, i.e., the so-called "b-factor", is defined by the following relationship:

$$b=\gamma^2 G^2 \delta^2 (\Delta - \delta/3)$$

where γ is the gyromagnetic ratio (42.58 MHz/Tesla for protons) and G is the magnetic field gradient amplitude. The diffusion-encoding gradient waveforms are usually optimized for short duration within the constraints of desired diffusion encoding and apparatus-specific gradient amplitude and slew rate limitations. The short duration ensures shortest possible echo time with maximum attainable signal-to-noise ratio (SNR).

In an experiment with one gradient pulse placed prior to and the other following the 180° radio frequency (RF) inversion pulse of a spin echo sequence (90° RF slice select—TE/2—180° RF inversion—TE/2—signal acquisition), the signal S in dependence of diffusion encoding b that results from the spin-echo measured at echo time TE in a simple isotropic diffusion environment like a liquid follows a monoexponential relationship:

$$S(b) = S_0 \exp(-bD).$$

In this relationship, $S_0$ depends upon machine constants, the spin-spin relaxation time $T_2$, the spin-lattice relaxation time $T_1$ in any experiment that repeats measurements every repetition time period TR, and the spin density ρ. Specifically, the diffusion coefficient D may be measured by making multiple measurements of S as a function of b, plotting the natural logarithm of S vs. b and then performing a linear regression whose slope provides the experimental measurement of D. Alternatively and preferably, a nonlinear least-square regression analysis can be used to directly infer the fitting exponential function without performing the logarithm operation. The value of b is most conveniently varied by keeping the gradient timings fixed and incrementing the amplitude G of the magnetic field gradient.

As will be seen from FIG. 1, the logarithmic decay of signal intensity from neat solutions of water as a function of b measured on a clinical scanner follows a straight line. This is indicative of a monoexponential signal decay above the base line noise level. In this example, the actual diffusion coefficient measured from the slope of the decay shown above the base line noise values is in excellent agreement with published literature values. Hence, for isotropic diffusion in neat liquids, it may be said that the logarithm of the intensity of the MR signal varies linearly with b above a given noise threshold.

Second, the extension of the foregoing concepts to the measurement of tissue water diffusion within the context of MRI led to certain adjustments in the above-stated theory. It was quickly realized that in certain organs like the brain, preferred directions of water diffusion exist. More particularly, diffusion along one direction, as selected by the direction of the magnetic field gradient vector could be different than the diffusion along another direction. In the brain, this lack of isotropy of the diffusion coefficient (the so-called "diffusion anisotropy") is attributed to the presence of nerve fiber tracts along which water is more free to move than it is in directions perpendicular to these tracts.

Indeed, in the light of the phenomenon of restricted or anisotropic diffusion, it generally is agreed in the art that at least three orthogonal directions of the diffusion sensitization gradient (which are independent of the preferred directional diffusion) should be sampled to generate trace images, i.e., maps of a rotationally invariant measure of diffusion. Further, a minimum of six directions must be sampled for each voxel, to determine the preferred direction of diffusion with the diffusion tensor formalism. More advanced formalisms have been developed for use with acquisition protocols that sample much more than six directions. This approach can be useful to detect the presence and orientation of crossing fibers.

Thus, the current trend in the clinical implementation of diffusion imaging is to sample images of multiple sections in an organ, each at least at a low and a high b-factor, the latter being typically on the order of about 1000 s/mm². This high b-factor sampling commonly is repeated for three orthogonal diffusion sensitizing gradient directions, if only a rotationally invariant measure of diffusion is needed, or at least six non-collinear and non-coplanar diffusion sensitizing gradient directions, if the assessment of diffusion anisotropy and preferred direction of diffusion is planned. Nevertheless, despite additional complexity added by the diffusion tensor formalism, the logarithmic plot of signal versus b-factor along a selected diffusion sensitizing direction is still seen to follow a substantially monoexponential best-fit relationship.

Still other experiments, however, have suggested that the monoexponential signal decay vs. b-factor relationship just mentioned may not be necessarily accurate. Thus in vivo studies of water diffusion in brain, liver and prostate have suggested that the signal decay variation with b-factor is a biexponential function over a limited b-factor range under 500 s/mm². Although the departure from a simple monoexponential decay was found to be small, it is generally considered to be attributable to perfusing blood. More specifically, blood in the micro-circulation has a very high diffusion coefficient that is not attributable to the normal, thermal Brownian motion associated with the remainder of the tissue water (i.e., water within and between the cells, but not in the vasculature). Consequently, there is a general consensus that there is indeed a small, very quickly diffusing component contributing to signal decay at low b-factors under 300 s/mm² in blood perfused organs.

To minimize the effect of perfusion on the measured diffusion coefficient, routine clinical MR diffusion imaging is conducted at b-factors of between about 100 and 1000 s/mm². Diffusion coefficient maps are then generated on a pixel-by-pixel basis assuming that the "best-fit" relationship between the MR signal and the b-factor is a monoexponential function (substantially as set forth above with regard to isotropic diffusion).

As will be seen from FIG. 2, with an extended b-factor measurement range, the diffusion-attenuated signal in tissue at higher b-factors is distinctly higher as one might predict by looking only at signals obtained up to a b-factor of 1000 s/mm² and then extrapolating to higher b-factors with a mono-exponential function. It is generally agreed upon that the observed departure from a mono-exponential decay over this extended decay stems from the presence of different diffusion environments within an image voxel. One obvious cause can be a partial volume effect from a voxel containing both tissue and liquid, e.g., a voxel where tissue borders to cystic fluid. The diffusion within the cyst would be similar as in a neat solution of water at body temperature, but higher than in the adjacent tissue. Such partial volume contributions of liquid pools can be eliminated with a suitable sequence of excitation pulses that exploit differences in T1 relaxation. With such preparation, signal decays are comparable to voxels with uniform tissue content, but still exhibit clearly non-mono-exponential signal decay. The consensus is that in tissues at least two compartments can be differentiated, i.e., an extra-cellular compartment with hindered diffusion and an intra-cellular compartment restricted by the cell membrane.

Accordingly, higher-order signal decay models have been proposed that account for the presence of more than one diffusion compartment. One of the simplest models that describe a non-monoexponential diffusion signal decay and which also reflects the nature of two compartments is the biexponential model:

$$S(b)=S_0(f \cdot \exp(-bD_f)+(1-f) \cdot \exp(-bD_s))$$

In this equation, $D_f$ and $D_s$ describe the diffusion coefficients of two compartments with fast and slow diffusion, respectively. The fraction f is used to account for the relative signal contribution of each compartment.

While this model has been highly successful to describe the observed tissue water signal decay at higher b-factors in different tissues, e.g., the extra and intra-axonal diffusion orthogonal to nerve fibers, it may not be sufficient to fully describe the observed signal decay. It has been suggested that diffusion within the cells is also compartmentalized, e.g., by organelles, such as the nucleus, mitochondria and vesicles, which are known to be surrounded by membranes that impede the water exchange with their surroundings. One obvious extension of the biexponential model would be to add one or even more compartments, each characterized by a different diffusion coefficient. However, it was soon realized that the prevailing noise in typical data would usually not permit the finding of stable numerical solutions for more than two compartments. An inverse Laplace transform of the measured decay signal would be the mathematical method to systematically decompose the multi-exponential signal decay into different components, each with a specific mono-exponential decay. However, such approach would not be practical below SNRs of at least 1000:1 (where SNR ratio refers to the SNR of the image with the lowest diffusion weighting), a level that is at least off by a magnitude from what is observed in typical clinical exams.

Nevertheless, in order to account for a multitude of compartments with different diffusion coefficients, it was then suggested to employ fits that rely on a continuous distribution of coefficients. A gamma distribution of diffusion coefficients, characterized by the shape parameter k and the scaling parameter θ results in the following particularly simple relationship for the signal decay without any exponential function:

$$S(b) = \frac{S_0}{(1+\theta b)^k}$$

This relationship describes observed signal decays in tissues remarkably well. Another distribution of diffusion coefficients results when the signal decay relationship is described with a stretched exponential function:

$$S(b)=S_0 \exp(-(bD)^\alpha)$$

Where a stretching coefficient α introduces the deviation from a simple mono-exponential decay. The resulting distribution is characterized by a relatively large contribution of fast diffusion compartments, which makes it suitable to account for the perfusion effect discussed earlier.

Yet, another widely used model is based on the analysis of changes in the spin displacement probability distribution. In the case of a mono-exponential decay, the spin displacement probability distribution is a normal distribution. The deviation from a normal distribution is expressed by the excess kurtosis factor K and the relationship between measured signal S and b can be approximated with a Taylor expansion of the decaying exponential. It is usually truncated to a second-order polynomial in b according to the following relationship:

$$S(b) = S_0 \exp\left(-b \cdot ADC_K + b^2 \cdot ADC_K^2 \cdot \frac{K}{6}\right)$$

The variable $ADC_K$ represents the apparent kurtosis diffusion coefficient. Since the Taylor expansion is truncated, the positive second order term starts to dominate at higher b-factors and, therefore, from a certain b-factor on an increase of the fitted signal, rather than a decay, can be observed. To ensure that S(b) is a monotonically decreasing function of the b-factor, an upper bound $b \leq 3/(K \cdot ADC_K)$ can be derived.

For SNRs prevalent in clinical exams none of the models follows the observed signal decay significantly and distinguishably better; especially if the b-factor range extension is moderate, e.g., up to 2000 s/mm². As will be seen from FIG. 2, for a wider range and SNRs in excess of 200:1, however, the gamma distribution related model and the biexponential model yield superior fits.

While at prevailing SNRs all of these higher-order model functions describe the observed decays sufficiently well, there has not been a wide-spread clinical adoption of diffusion measurements that would permit such analyses. One major reason is that non-monoexponential analysis, in comparison to the basic monoexponential analysis, is characterized by diminished robustness in parameter estimation and significantly noisier parameter maps. Moreover, a multi-parametric assessment lacks the diagnostic simplicity of a single diffusion coefficient map that results with monoexponential analysis.

Given that the diffusion signal decay in tissues shows a departure from an ideal monoexponential diffusion related signal decay at both low and high diffusion weighting, diffusion coefficients determined by monoexponential signal analysis, are referred to as "apparent diffusion coefficients" (ADC) rather than more generically as diffusion coefficients D. As will be seen from FIG. 3, if mono-exponential analysis of tissue water diffusion is performed for different maximum b-factors, it is quite obvious that ADC will depend on the choice of the maximum b-factor. It is important, however, to note that such variation of the ADC is also observed for measurements below 1000 s/mm², i.e., a range where, provided perfusion effects can be disregarded by choosing a suitable lowest b-factor, the mono-exponential function is considered an adequate fit. It can also be shown that the number of measurement points and the fitting method, i.e., linear-least square fitting after logarithmizing or direct nonlinear least square fitting, influences the result.

This clearly speaks against the universal establishment of ADC as a measure to quantitatively categorize lesions, particularly since there are no standardized b-factor measurement ranges. As can be seen from FIG. 4, even the establishment of consistent settings for b-factors would not be successful, since b-factors will invariably vary within the imaging volume due to non-linearities of the magnetic field gradients, leading to a spatial ADC dependence.

SUMMARY OF THE INVENTION

The present invention uses retrospective monoexponential fitting to function values of non-monexponential (higher-order) fits applied to MR signals measured at multiple weighting levels. Compared to the direct monoexponential fitting to measured signals that is conventionally applied, fundamental advantages arise. Firstly, the retrospective selection of weighting levels for which function values are determined, can be done with minimal restrictions. This implies the ability to replicate any desired sampling protocol retrospectively, even if the measured range of weighting levels is not consistent. Secondly, the noise-related variance of a fit is typically much smaller than the noise-related variance of the data the fit was applied to. This implies that both weighted images and parameter maps can be reconstructed that exhibit much higher SNR than would result from using the measured data or direct fits thereto. A prime application area is the field of diffusion-weighted Mill. Here, because the ADC determined with the new method exhibits minimal dependence on sampled range of diffusion-weighting levels, tissue ADC quantification errors at off-center locations can be avoided by using actual diffusion-weighting levels rather than nominal diffusion-weighting levels. Similarly, this latitude in the range of measured diffusion-weighting levels can be gainfully employed to harmonize diffusion imaging protocols in terms of echo time and diffusion encoding time for systems with different gradient hardware capability. Thus, the proposed method will permit truly reproducible ADC measurements, which can have great implications for quantitative tissue characterization in Mill.

DETAILED DESCRIPTION OF THE INVENTION

Figure 1:
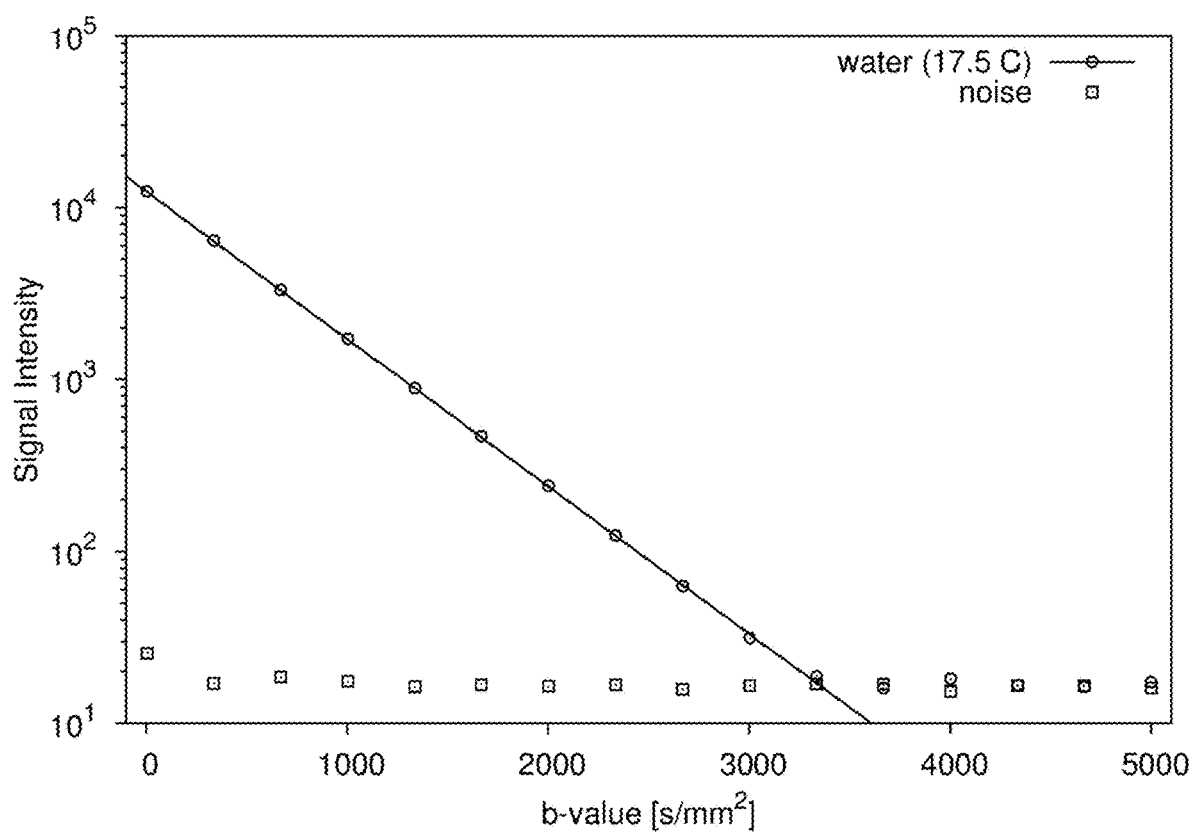
FIG. 1 is an illustrative graphical representation of the logarithmic decay signal intensity from pure water at 17.5 C as a function of b-factor.
Figure 2:
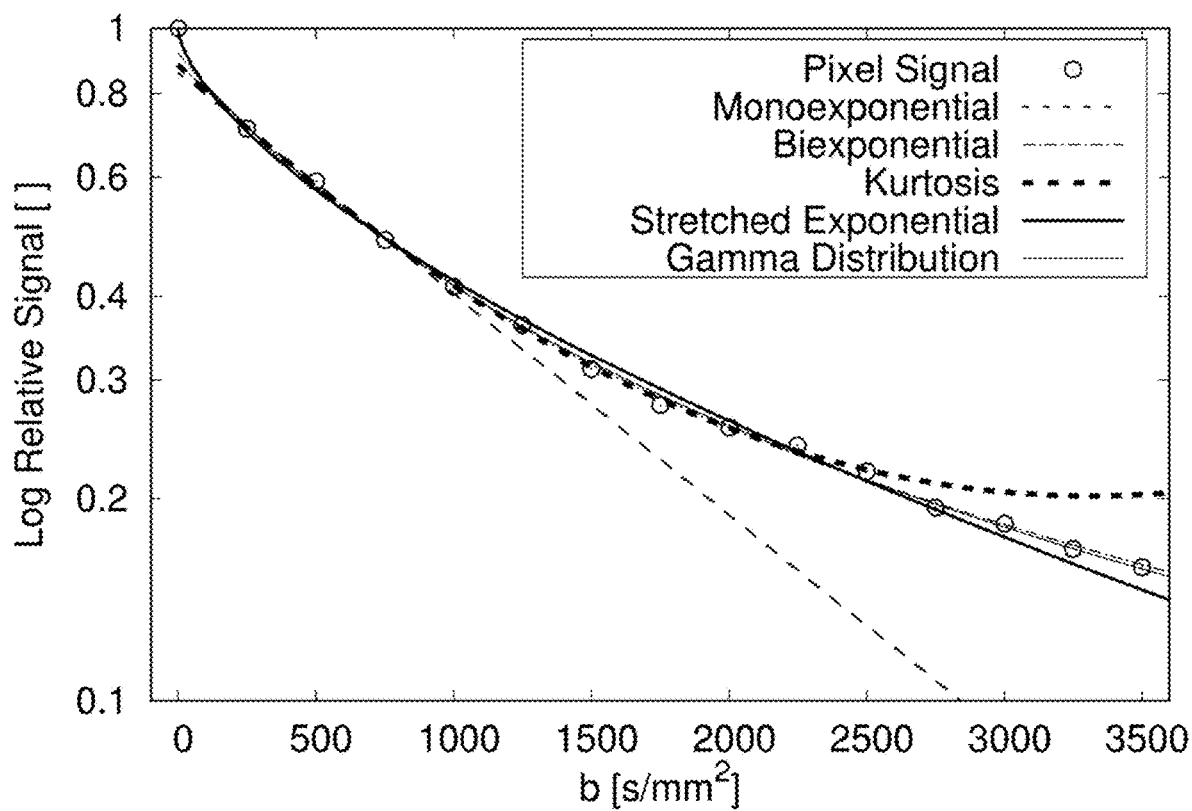
FIG. 2 is an illustrative graphical representation of the logarithmic decay signal intensity of diffusing water in a biological tissue (prostate tumor) as a function of b-factor, with mono-exponential and non-monoexponential model fits.
Figure 3:
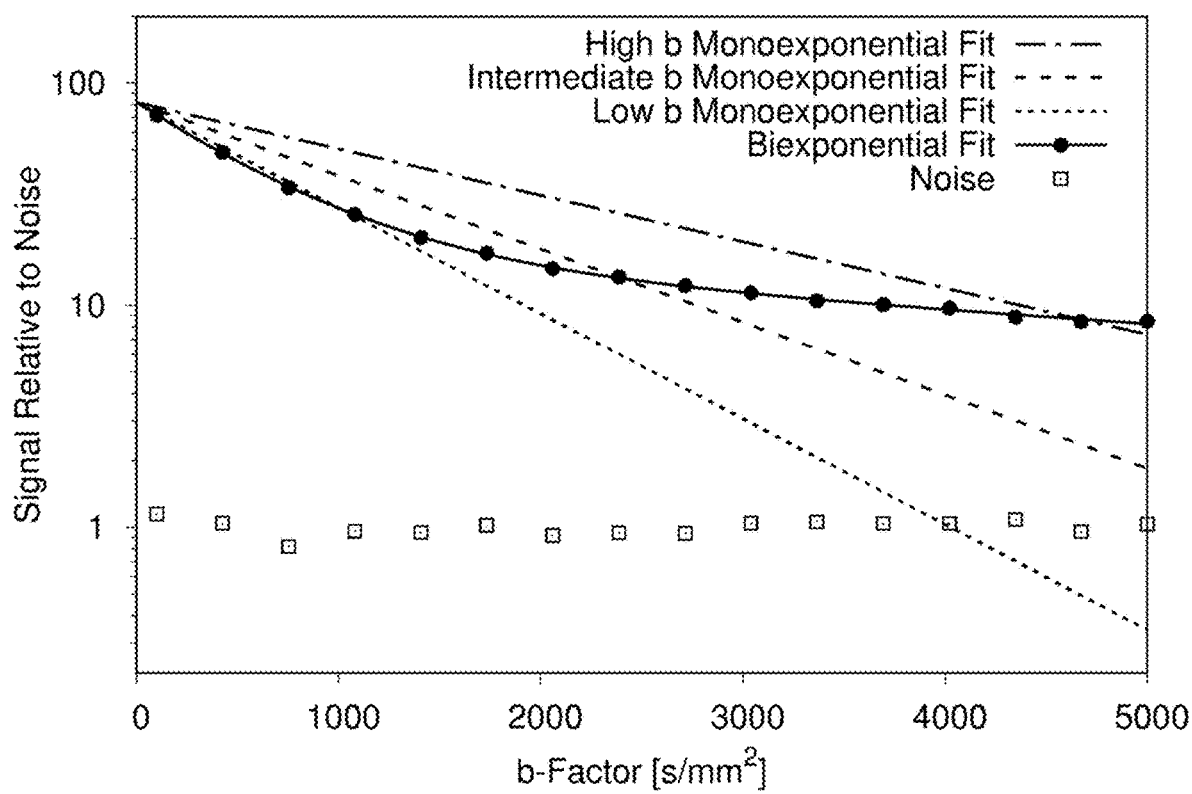
FIG. 3 is an illustrative graphical representation of the logarithmic decay signal intensity of diffusing water in a biological tissue (brain tumor) as a function of b-factor, with a biexponential model fit that follows the measured signal decay and monoexponential fits that result with different maximum b-factors.
Figure 4:
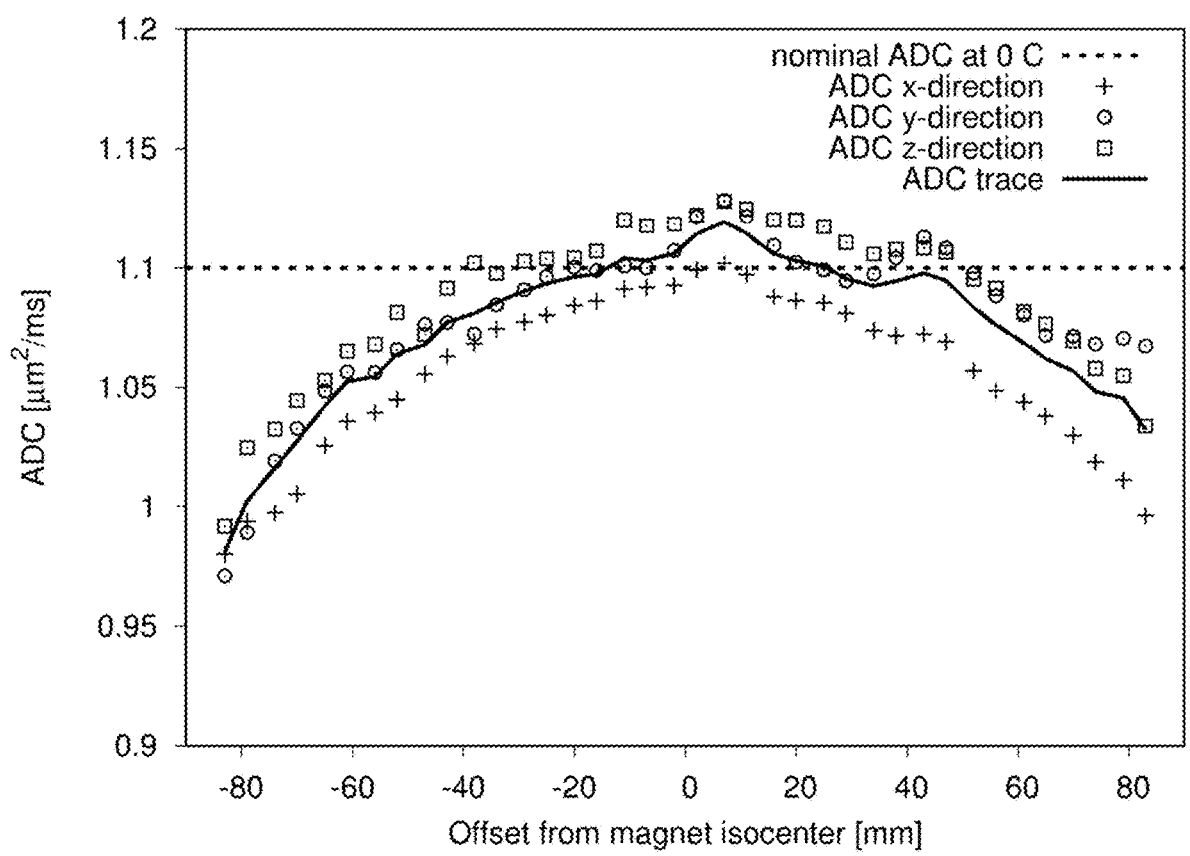
FIG. 4 is an illustrative graphical representation of the ADC measured with b-factors 0 and 1000 sec/mm$^2$ at different locations along the magnet principal axes x, y, and z in a water phantom surrounded with ice-water and a known ADC value of 1.1 µm$^2$/ms at 0 C temperature.

The invention relies on the non-monoexponential analysis of diffusion signal decays. This implies measuring a wider range of diffusion weighting levels than commonly applied in routine clinical diffusion imaging. With conventional ADC measurements, range and number of diffusion weighting levels, i.e., b-factors, are defined with the protocol used during the acquisition. This choice cannot be modified after the acquisition. With water diffusion measurements in biological tissues, unlike diffusion measurements in neat liquids, the presence of multiple diffusion compartments with distinct diffusion behavior produces multiexponential signal decays. These decays cannot be adequately described with the monoexponential model that is used in the calculation of the ADC. A consequence of this deficient model is a tremendous dependence of the resulting ADC on the range, distribution and number of diffusion weighting levels. Since there is no agreement on protocols, tissue ADC values and recommended thresholds for differentiating tissues vary widely among sites. And even if there was such agreement, it would not hold for the measurement at off-center positions, since gradient non-linearities would lead to a different diffusion encoding than nominally given by the protocol. While it is obvious that prior collection of many diffusion weighting levels does permit a selection of suitable encoding levels after the fact, this would constitute an inferior approach, since not necessarily measurements from all encoding levels would contribute to the final result, i.e., the ADC map. This approach is considered even more flawed in view of the fact that often signal averaging is employed to reach an acceptable SNR. Averaging is not only needed in order to attain ADC maps of diagnostic quality, but also to generate diagnostically valuable diffusion-weighted images with adequate contrast-to-noise ratio for lesion detection. Hence, sampling at many diffusion weighting levels with averaging would result in overly long scan times.

With the present innovation a largely overlooked benefit of fitting comes into play, namely that for most encoding levels the noise-related variance of a fit is much smaller than the noise-related variance of the data the fit was applied to. Thus, for arbitrary weighting levels, signal values can be generated that exhibit less variation than the underlying data. Consequently, time spent on signal averaging in a conventional protocol can instead be used for sampling of many diffusion weighting levels over an extended range. Sampling of a larger number of signals over a wide range of different diffusion weighting levels also opens the possibility to apply advanced fitting methods that allow noise estimation and correction of Rician signal bias in areas of low signal. Any monoexponential sampling protocol can then be performed retrospectively by selecting data points along the fit, i.e., data points characterized by little noise-related variation, and then performing a monoexponential fit to these data points in order to obtain the ADC. The diffusion-weighting level sampling pattern can be adjusted to control the variation of fitted signal values at particular levels, e.g., by changing sampling density or by signal averaging at a selected diffusion-weighting level. To some extent even the sampling range can be varied, without impacting the resulting fit. This means that gradient non-linearities at off-center locations can be accounted for, by simply adjusting the nominal sampling points defined by the protocol. It also means that sampling protocols can appropriately be varied to retain equal echo time and diffusion encoding time among MR systems with different magnetic field gradient capability.

Figure 5:
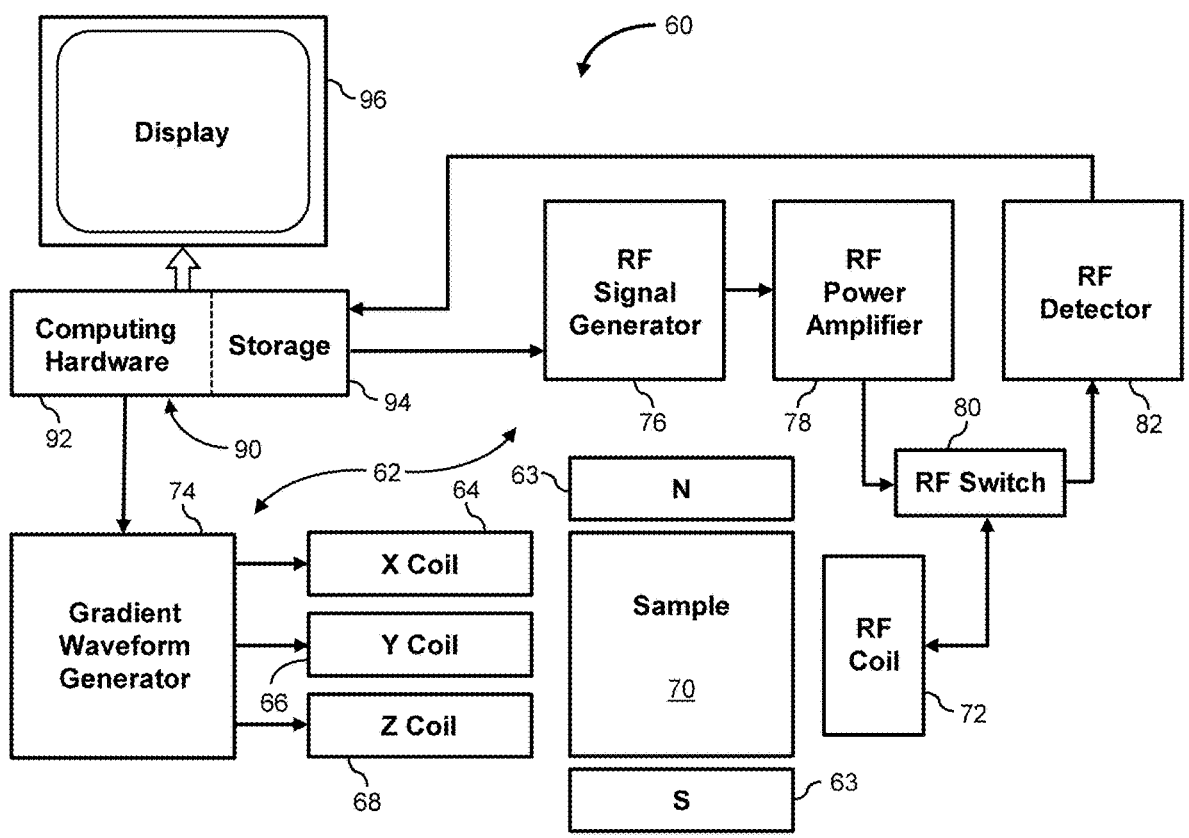
FIG. 5 is a high-level block diagram of an illustrative embodiment of a Mill system suitable for use in the method of present invention.
Figure 6:
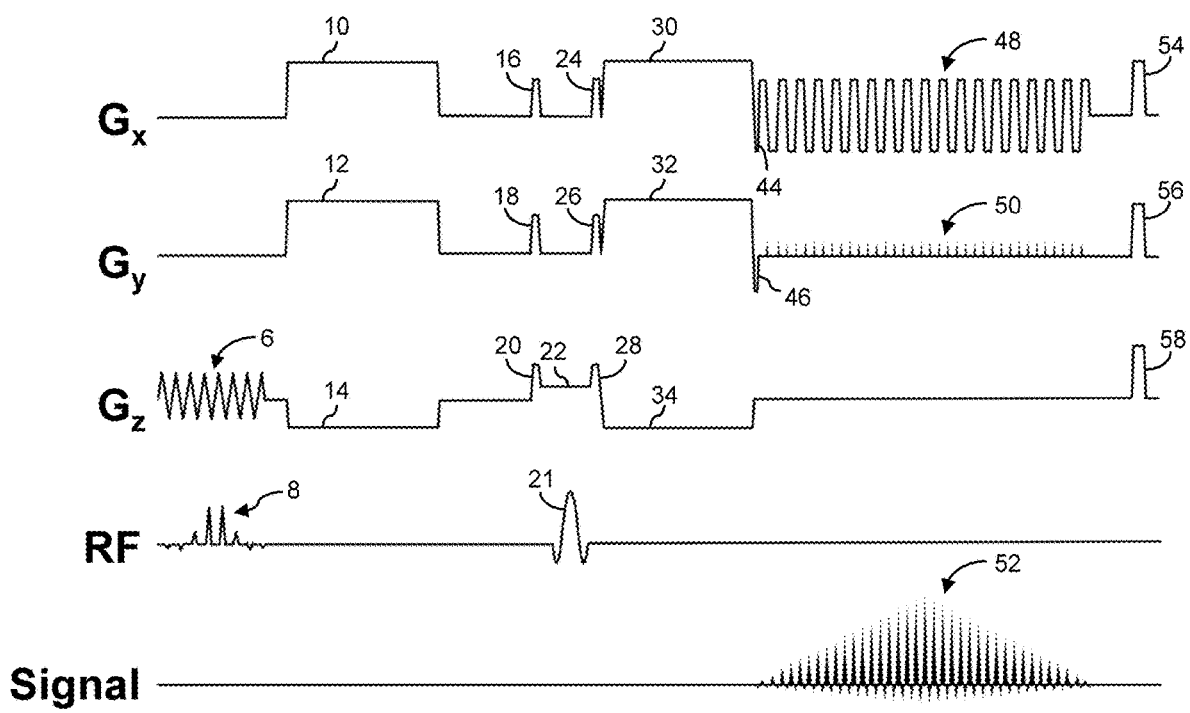
FIG. 6 shows in one diagram over a common time axis the sequence of magnetic field pulses, radiofrequency pulses, and acquired radiofrequency signals for image formation based on a prior art pulse sequence design for a single-shot 2D echo-planar readout using diffusion-weighting preparation on the system illustratively depicted in FIG. 5. It may be mentioned that the illustrated time diagram is not drawn to scale, i.e. the individual time sections and the amplitudes are not drawn in accordance with their actual mutual size ratios.

An apparatus and pulse sequence suitable for the practice of this invention, as will be seen from FIGS. 5 and 6, includes an MRI system 60, generally having a magnet assembly, interface circuitry, and a computer 90. The magnet assembly includes a very strong magnet 63 that creates a homogeneous magnetic field within and around a sample (e.g. an inert sample or patient). X, Y, and Z magnetic field gradient coils 64, 66, and 68 also form a part of the assembly and are positioned proximate or surrounding the sample 70. The assembly further comprises one or more RF coils 72, which are positioned near or around the sample.

The interface circuitry 62 includes a gradient waveform generator 74 with a control input connected to the computer and signal outputs connected to the gradient coils 64, 66, and 68, as well as an RF signal generator 76 with a control input connected to the computer and an output connected to an input of an RF power amplifier 78. The RF power amplifier has an output connected to an input of an RF switch 80. The RF switch has an output connected to the RF coil 72 and an output connected to the input of an RF detector 82.

The computer 90 includes computing hardware 92 and storage 94. The computing hardware can comprise special purpose hard-wired computing circuitry dedicated to MR acquisition and image reconstruction, as well as a special programmed general purpose computer for display and user interaction. The storage 94 can include various types of storage, such as disk storage and random access memory. The storage can be used to store data and programs, including programs used to interact with the system's interface circuitry 62. The computer has a video output for providing video signals to a display 96, as well as control outputs connected respectively to control inputs of the gradient waveform generator 74 and the RF signal generator 76. The computer also has acquisition input operatively connected to an output of the RF detector 82.

In operation, referring to FIGS. 5 and 6, the imaging system 60 builds images under the control of the computer 90 according to a echo-planar imaging (EPI) sequence. At the beginning of an acquisition sequence for an image, the computer 90 sends a signal to the RF signal generator 76, which responds by generating a spatially and spectrally selective pulse 8 with a flip angle of 90° or greater. This pulse is amplified by the RF power amplifier 78 and provided to the RF coil 72 via the RF switch 80. As this pulse is being provided, the computer instructs the gradient waveform generator 74 to drive the Z coil 68 with a multi-polar pulse group 6.

Next, the gradient waveform generator 74 provides a set of gradient pulse groups 10, 12, and 14 for the first part of diffusion encoding respectively to the X, Y, and Z gradient coils 64, 66, and 68. After the falling edge of the diffusion gradient signals and a wait time, which is inserted if needed to center the echo refocusing for the readout process, the gradient waveform generator 74 provides a set of dephasing gradient pulses 16, 18, and 20 respectively to the X, Y, and Z gradient coils 64, 66, and 68. Subsequently, a spatially selective 180° refocusing pulse 21 is provided to the RF coil 72, in much the same way that the spatial-spectral selective pulse was. At the same time, the gradient waveform generator provides a rectangular pulse 22 on the Z gradient coil. Then, the gradient waveform generator 74 provides a set of rephasing gradient pulses 24, 26, and 28 of same amplitude and duration as the dephasing gradient pulses respectively to the X, Y, and Z gradient coils 64, 66, and 68. Then, the waveform generator provides a set of gradient signals 30, 32, and 34 for the second part of diffusion encoding respectively to the X, Y, and Z gradient coils 64, 66 and 68. Both parts of the diffusion encoding gradient signals to the X, Y, and Z gradient coils are scaled to attain a desired diffusion weighting and diffusion encoding direction.

Once the gradient signals for diffusion encoding are turned off, the gradient waveform generator provides a set of dephasing gradient pulses 44, and 46 respectively to the X and Y gradient coils 64 and 66. Then the gradient waveform generator provides gradient pulse group 48 on the X coil 64 for spatial encoding along the frequency encoding direction and at the same time gradient pulse group 50 on the Y coil 66 for spatial encoding along the phase encoding direction. As a result of this excitation sequence, a train of echoes 52 is received from the slice or volume that was excited by the spatial-spectral selective RF pulse and the 180° RF pulse. The RF coil receives these echoes and provides them via the RF switch 80 to the RF detector, from where the digitized signals are forwarded to the data storage 94. After the signal echoes have been received, optional crusher gradient signals 54, 56, and 58 can be applied respectively to the X, Y, and Z gradient coils 64, 66 and 68. The computer 90 processes the signal data of the image echoes 52 and the image for this diffusion encoding can be displayed on the display 96.

Scanning can be performed sequentially for a plurality of diffusion encoding gradient amplitudes and a plurality of diffusion encoding directions. The sampling of diffusion-weighting levels can occur with even b-factor increments, but other sampling schemes with non-uniform sampling density may also be considered. After obtaining images for all diffusion encoding levels and all diffusion encoding directions processing can be initiated to generate higher-order model fits to the measured signal decay at each pixel position. This implies the measurement of a sufficient number of diffusion encoding levels to support such higher order model fits. Then, for each pixel position, the signal values estimated by the fit function for at least two predefined diffusion weighting levels are used to fit a monoexponential diffusion signal decay function with the ADC parameter as result. In pixels where noise or other errors prevent a meaningful calculation of ADC, a placeholder value can be used instead. Maps of the ADC parameter and maps of signals estimated by the higher-order model fit at diffusion weighting levels of particular interest can then be displayed on the display 96 for diagnostic assessment.

For protocol planning it can be useful to understand the signal averaging effect that arises by the higher-order model fit. Assuming Gaussian noise, the averaging effect is a measure of how many repeated acquisitions are necessary at a certain b-factor to attain the same reduction in noise standard deviation as observed with model fitting. The signal averaging effect can be estimated through repeated simulation using a predefined signal decay function with added Gaussian noise $\sigma_g$ followed by fitting with the higher-order model function. Ideally the signal decay function is generated with the higher-order model function using predefined parameters, but this does not need to be case, as long as the evaluation is performed over a limited encoding range, where noise related deviations are significantly larger than deviations between functions. The averaging effect AE as a function of the b-factor b can be defined as $$AE(b) = \left(\frac{\sigma_g}{STD(S_{fit}(b))}\right)^2$$

with $$STD(S_{fit}(b)) = \sqrt{\frac{1}{N}\sum_{i=1}^{N}S(b;\theta_i)^2 - \left(\frac{1}{N}\sum_{i=1}^{N}S(b;\theta_i)\right)^2}$$

where $STD(S_{fit}(b))$ is the standard deviation for N model fits and $\theta_i$ the vector containing the model parameters that result with fitting of realization i.

Alternatively, the averaging effect can be calculated using an analytical expression for the data error $\sigma_y(b; a)$ proposed by Richter (The Telecommunications and Data Acquisition Progress Report, TDA PR 42-122, April-June 1995, pp. 107-137), where $a=[a_0, a_1, \ldots, a_{M-1}]$ is a vector containing the true free model parameters (Min total) and b is the b-factor. The derivation of $\sigma_y(b; a)$ in the case of non-linear least square estimation rests on the assumption that the model function and the least square error can be expressed as a Taylor expansion around a of first and second order, respectively. This is important as considerations from the linear least square case are then applicable. The averaging effect AE in this case is then calculated as $$AE(b) = \left(\frac{\sigma_g}{\sigma_y(b;a)}\right)^2$$

With such analytic expressions it can be shown that for a sufficiently large number of samples the averaging effect grows approximately proportional to the number of samples. It also can be shown that the mean of the averaging effect over all b-factors decreases proportionally with the number of free parameters of the higher order model function. Thus, it is in general preferable to choose higher order-model functions with a low number of free model parameters as long as the model function is suitable for the data in question.

The prime application of the innovation is in diffusion image analysis, but it is equally applicable in the quantitative assessment of any MR relaxation process that is characterized by non-monoexponential relaxation.

EXAMPLE

The signal averaging effect was simulated and analyzed analytically for the biexponential, a kurtosis, and a gamma distribution model function. The signal data used for simulation relied on signals generated by two biexponential tissue models. For simulation of prostate normal peripheral zone (PZ) tissue, the fast diffusion coefficient $D_f$ was set to 2.2 µm$^2$/ms, the slow diffusion coefficient $D_s$ to 0.4 µm$^2$/ms and the relative fraction f to 0.8. Meanwhile, for simulation of prostate cancer tissue in the PZ, the fast diffusion coefficient $D_f$ was also set to 2.2 µm$^2$/ms, the slow diffusion coefficient $D_s$ to a lower value of 0.2 µm$^2$/ms and the relative fraction f to a lower value of 0.6. These model parameters were selected in approximate accordance to literature values based on measurements that exclude the influence of intra-voxel incoherent motion (IVIM). The signal data used for simulation was generated by the two biexponential tissue models at N=21 b-factors, evenly distributed in the range from 0 to $b_{max}$. For the upper limit $b_{max}$ values of 1500, 2000, and 2500 s/mm$^2$ were evaluated. Simulations were performed at SNR=20. For each simulation scenario, 60000 signal data realizations were created by adding Gaussian noise according to the simulated SNR. Each of the resulting signal decay profiles was fitted with biexponential, kurtosis and gamma distribution model functions by means of non-linear least square estimation and the resulting signal values S(b) at the 21 assumed measurement b-factors were calculated for each model function.

The analytic assessment of the averaging effect used the same tissue models. For the biexponential model function the biexponential tissue model parameters $D_f$, $D_s$, and f can directly be transferred to the a vector. For the kurtosis and gamma distribution model, approximate true model parameters a were determined by means of direct fitting of the biexponential tissue model data.

Figure 7A:
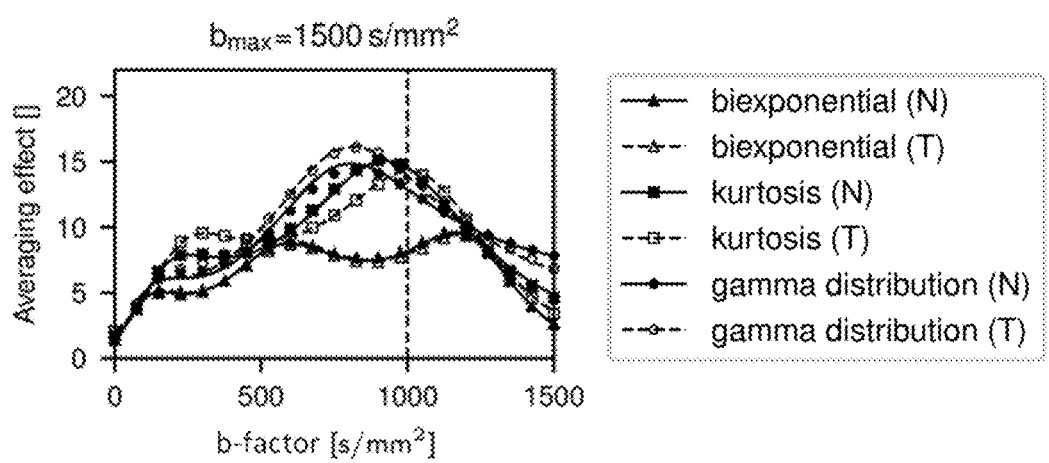
FIGS. 7A-C are illustrative graphical representations of simulations at discrete b-factors and continuously evaluated analytic solutions of the averaging effect in simulated normal prostate tissue (N) and simulated tumorous prostate tissue (T) with different higher-order model fitting approaches for a maximum diffusion weighting level $b_{max}$=1500 s/mm$^2$ (FIG. 7A), for a maximum diffusion weighting level $b_{max}$=2000 s/mm$^2$ (FIG. 7B), and for a maximum diffusion weighting level $b_{max}$=2500 s/mm$^2$ (FIG. 7C)
Figure 7B:
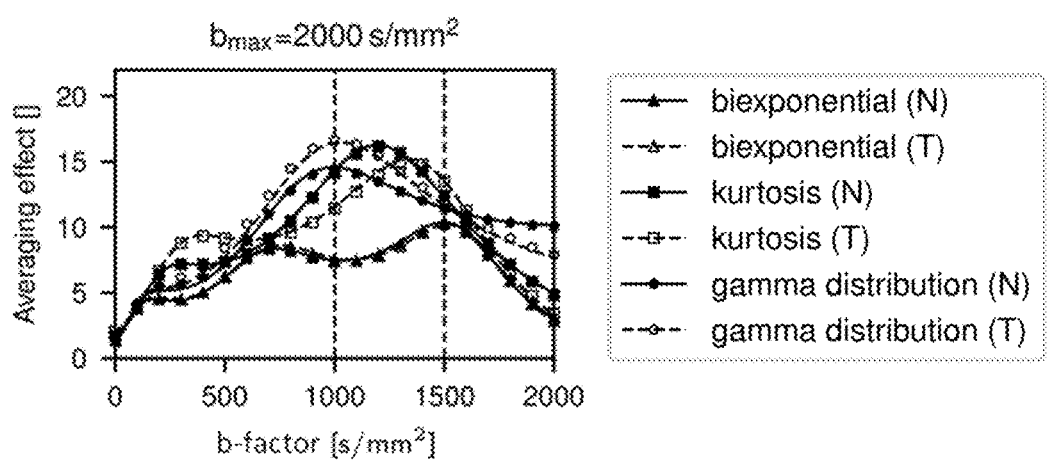
Figure 7C:
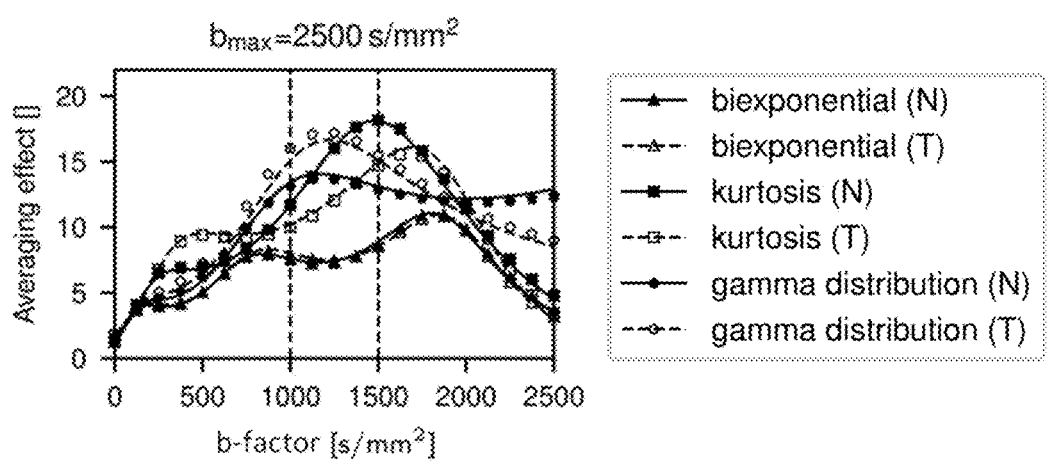

FIGS. 7A-C shows the averaging effect for $b_{max}$ values of 1500, 2000, and 2500 s/mm$^2$, respectively. Vertical dashed lines indicate the b-factors that are relevant in clinical imaging, i.e., a high b-factor of 1000 s/mm$^2$ is typical for a brain exam and a high b-factor of 1500 s/mm$^2$ is considered optimal to examine prostate lesions on a diffusion-weighted image. A good agreement of the averaging effect estimated with simulation (symbols) and analytic assessment (continuous lines) for simulated prostate normal (N) tissue and simulated prostate tumor (T) tissue is evident. An average of the approximate true model parameters a determined for the different $b_{max}$ values was used for the kurtosis and gamma distribution model. Accordingly, with the highest $b_{max}$ value, an obvious deviation between simulation and analytic assessment can be seen for part of the evaluated range of b-factors. For a given model function, the overall shape of the AE curve appears to be independent of the maximum b-factor. Thus, an increase in $b_{max}$ leads to a stretch of the curve over a larger b-factor range. For b=0, irrespective of higher-order model tested, the averaging effect is weak, i.e., AE≈1.

The same tissue models were also used to obtain simulated results of applying the innovation to obtain a retrospective monoexponential fit. The signal data used for simulation was generated by the two biexponential tissue models at N=21 b-factors, evenly distributed in the range from 0 to 2000 s/mm$^2$. Simulations were performed at SNR=20. For each simulation scenario, 60,000 signal data realizations were created by adding Gaussian noise according to the simulated SNR. Fitted signal values for each of the higher-order model functions at diffusion encoding levels 100, 1000, and 1500 s/mm$^2$ were used to apply monoexponential fits and to derive the ADC values. The choice of these encoding levels was in accordance with an existing clinical protocol. Since the clinical protocol involved 6-fold averaging, 10,000 realizations of clinical reference data were generated by 6-fold averaging of the signal decay data realizations for the diffusion encoding levels 100, 1000, and 1500 s/mm$^2$. The following table shows an excellent agreement between ADC values resulting with the conventional and the proposed analysis that uses a retrospective fit. The nominal SNR is very similar, even though the retrospective fit was performed with unaveraged data. This reflects the influence of the averaging effect of the higher model fit. All results were obtained with non-linear regression analysis.

| Simulation Method | Model | Normal Tissue ADC [μm$^2$/ms] | Tumor Tissue ADC [μm$^2$/ms] |
| --- | --- | --- | --- |
| Clinical | Monoexponential | 1.39 ± 0.08 (17.0) | 0.79 ± 0.04 (18.0) |
| Retrospective Fit | Kurtosis | 1.40 ± 0.09 (15.3) | 0.79 ± 0.06 (13.2) |
| Retrospective Fit | Biexponential | 1.39 ± 0.09 (15.5) | 0.79 ± 0.06 (14.0) |
| Retrospective Fit | Gamma Distribution | 1.38 ± 0.09 (15.7) | 0.79 ± 0.06 (13.6) |

All values given as mean ± standard deviation (nominal SNR = mean/standard deviation)

Figures 8A, 8B, 8C, 8D:
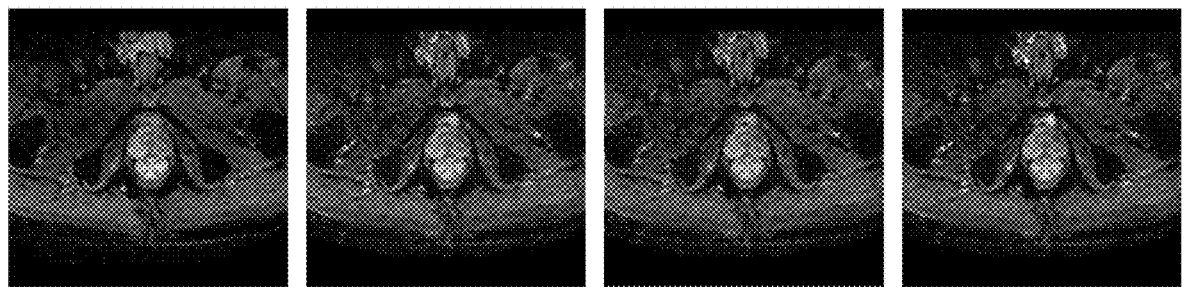
FIGS. 8A-D are illustrative graphical representations of ADC maps of the prostate obtained in a patient with a conventional clinical protocol (FIG. 8A) and fitting with the proposed method using a kurtosis model function and $b_{max}$ 2000 s/mm$^2$ (FIG. 8B), using a biexponential model function and $b_{max}$ 2000 s/mm$^2$ (FIG. 8C), and using a gamma distribution model function and $b_{max}$ 2000 s/mm$^2$ (FIG. 8D).

The innovation was also tested with diffusion-weighted images of the prostate. Subjects underwent an examination with the standard clinical prostate MRI protocol on a 3 T scanner (Philips Achieva dStream, Philips Healthcare, The Netherlands) and a pelvic-phased array coil was used for signal reception. Diffusion-weighted images were obtained according a standard clinical protocol at 3 mm isotropic resolution. Four b-factors, i.e., 0, 100, 1000, and 1500 s/mm$^2$ were acquired with 6-fold averaging using single-shot echo-planar imaging. For each b-factor higher than zero, images with diffusion encoding along each of three orthogonal directions were collected. The total scan time for the diffusion scan was 4 minutes and 4 seconds. The image acquisition for retrospective ADC analysis using fitted data was performed with the same image geometry and diffusion encoding directions as the clinical protocol, but without signal averaging. For each of three orthogonal encoding directions, diffusion-weighted images were collected for 21 evenly distributed b-factors ranging from 0 to 1500, 0 to 2000, or 0 to 2500 s/mm$^2$. The total scan time was 4 minutes and 12 seconds, i.e., not significantly different from the scan time of the clinical protocol. For the higher order fit only values over the range 100 s/mm$^2$ to $b_{max}$ were considered. Maps of ADC were generated with the averaged clinical images at b-factors 100, 1000, and 1500 s/mm$^2$ and with the images computed with higher-order model fits at the corresponding b-factors. An example of an ADC map resulting with the clinical method is shown in FIG. 8A. Examples of the corresponding ADC generated with this innovation using non-linear-regression are shown in in FIG. 8B, FIG. 8C, FIG. 8D, respectively. Regions of interest for the prostate peripheral zone and the prostate transition zone were defined on the ADC map. The following table shows an excellent agreement between ADC values resulting with the conventional clinical approach and the innovation that uses a retrospective fit. Even if the higher-order model changes, there is a remarkable agreement. A bias correction was performed with OBSIDIAN (Optimized Bias and Signal Inference in Diffusion Image Analysis) and as expected resulted in slightly higher ADC values.

| Measurement Method | Model | Peripheral Tissue ADC [μm$^2$/ms] N = 25 | Transition Zone ADC [μm$^2$/ms] N = 25 |
| --- | --- | --- | --- |
| Clinical | Monoexponential | 1.54 ± 0.20 | 1.24 ± 0.11 |
| Retrospective Fit | Kurtosis | 1.56 ± 0.21 | 1.25 ± 0.13 |
| Retrospective Fit | Biexponential | 1.53 ± 0.20 | 1.24 ± 0.11 |
| Retrospective Fit | Gamma Distribution | 1.53 ± 0.20 | 1.22 ± 0.11 |
| Retrospective Fit | Kurtosis bias corrected | 1.62 ± 0.22 | 1.34 ± 0.11 |

N: Number of subjects measured

All values given as mean ± standard deviation

Figure 9A:
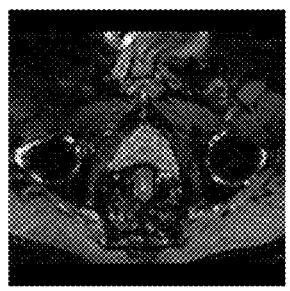
FIGS. 9A-D are illustrative graphical representations of ADC maps of the prostate obtained in a patient with a conventional clinical protocol (FIG. 9A) and fitting with the proposed method using a kurtosis model function and $b_{max}$ 1500 s/mm$^2$ (FIG. 9B), using a kurtosis model function and $b_{max}$ 2000 s/mm$^2$ (FIG. 9C), and using a kurtosis model function and $b_{max}$ 2500 s/mm$^2$ (FIG. 9D).
Figure 9B:
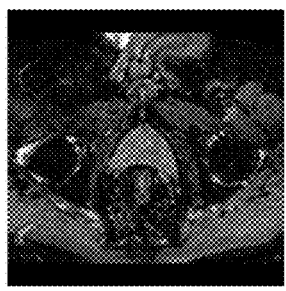
Figure 9C:
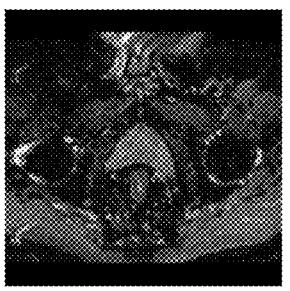
Figure 9D:
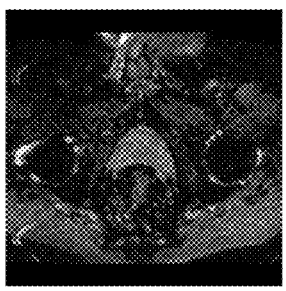

The measurement range can be varied without impacting the measured ADC, which is an important advantage of the innovation. FIG. 9A shows an ADC map obtained with the clinical method. The ADC maps shown in FIG. 9B, FIG. 9C, and FIG. 9D were obtained with $b_{max}$ values of 1500, 2000, and 2500 s/mm$^2$, respectively. Each of these ADC maps are practically indistinguishable from the clinical ADC map shown in FIG. 9A. The table below shows that for regions of interest, the mean ADC values determined on ADC maps that were obtained with different $b_{max}$ values are not significantly different from the mean ADC value determined on the clinical ADC map.

| Measurement Method | Model | Peripheral Zone ADC [μm$^2$/ms] N = 3 | Transition Zone ADC [μm$^2$/ms] N = 3 |
|---|---|---|---|
| Clinical | Monoexponential | 1.27 ± 0.06 | 1.16 ± 0.09 |
| Retrospective Fit $b_{max}$ = 1500 s/mm$^2$ | Kurtosis | 1.30 ± 0.06 | 1.19 ± 0.08 |
| Retrospective Fit $b_{max}$ = 2000 s/mm$^2$ | Kurtosis | 1.28 ± 0.06 | 1.17 ± 0.08 |
| Retrospective Fit $b_{max}$ = 2500 s/mm$^2$ | Kurtosis | 1.29 ± 0.06 | 1.18 ± 0.08 |

N: Number of subjects measured
All values given as mean ± standard deviation

In conclusion, embodiments of the invention can provide a new and highly practical technique to allow highly reproducible parameter mapping not only of MR diffusion signal decays, but any MR relaxation process. As such, it should find broad applications in clinical diagnosis and research investigations, where parameter maps that are accurate, with minimal spatial and system dependence are highly desirable.

One skilled in the art will readily appreciate that the present invention is well adapted to carry out the objects and obtain the ends and advantages mentioned, as well as those inherent therein. The present disclosures described herein are presently representative of preferred embodiments, are exemplary, and are not intended as limitations on the scope of the invention. Changes therein and other uses will occur to those skilled in the art which are encompassed within the spirit of the invention as defined by the scope of the claims.

The invention claimed is:

1. A method for producing parameter maps from magnetic resonance images obtained at a multitude of contrast-weighting levels, the steps comprising:
   a) selecting predefined contrast-weighting levels;
   b) performing at each image pixel position a higher-order function fit to the multitude of measured contrast-weighting level dependent signals at said pixel position;
   c) determining for each said pixel position computed signal values from said higher-order function fit at said predefined contrast weighting levels;
   d) performing at each said pixel position a monoexponential function fit through said computed signal values related to said pixel position at said predefined contrast weighting levels and determine a monoexponential decay parameter; and
   e) assemble said monoexponential decay parameter of all image pixel positions to a parameter map for display.

2. The parameter mapping method of claim 1, wherein said measured contrast-weighting levels extend over a wider range than said predefined contrast-weighting levels.

3. The parameter mapping method of claim 2, wherein the levels of said measured contrast-weighting levels are arranged linearly.

4. The magnetic resonance imaging method of claim 3, wherein signal averaging is performed for selected levels of said multitude of measured contrast-weighting levels.

5. The parameter mapping method of claim 2, wherein said higher-order function is applied to measurements of diffusion-weighted signal decays.

6. The parameter mapping method of claim 5, wherein for each selected pixel position and for each measured diffusion-weighing level, said higher order function fit is performed with the spatially dependent, actual diffusion-weighting level instead of a nominal diffusion-weighting level.

7. The parameter mapping method of claim 6, wherein system-specific adjustments of said measured contrast-weighting level range are made, to attain equal echo time and diffusion encoding time for different magnetic resonance imaging systems.

8. The parameter mapping method of claim 7, wherein the magnitude signal of the complex diffusion-weighted signal is bias corrected.

9. The parameter mapping method of claim 8, wherein the levels of said measured contrast-weighting levels are arranged linearly.

10. The magnetic resonance imaging method of claim 9, wherein signal averaging is performed for selected levels of said multitude of measured contrast-weighting levels.

11. The magnetic resonance imaging method of claim 10, wherein said higher model function fit uses a kurtosis function.

12. The magnetic resonance imaging method of claim 10, wherein said higher model function fit uses a biexponential function.

13. The magnetic resonance imaging method of claim 10, wherein said higher model function fit uses a function that is associated with a gamma distribution of the exponential decay parameters.

14. The magnetic resonance imaging method of claim 10, wherein said higher model function fit uses a stretched exponential function.

15. A magnetic resonance imaging apparatus, comprising:
   a) means for providing images of signals at a multitude of contrast-weighting levels;
   b) means for selecting predefined contrast-weighting levels;
   c) means for performing at each image pixel position a higher-order function fit to the multitude of measured contrast-weighting level dependent signals at said pixel position;
   d) means for determining for each said signal pixel position computed signal values from said higher-order function fit at said predefined contrast weighting levels;
   e) means for performing at each said pixel position a monoexponential function fit through said computed signal values related to said pixel position at said predefined contrast weighting levels and determine a monoexponential decay parameter; and f) means to assemble said monoexponential decay parameter of all image pixel positions to a parameter map for display.

* * * * *